United States Patent
Chen et al.

(10) Patent No.: US 8,705,771 B1
(45) Date of Patent: Apr. 22, 2014

(54) LINE-IN SIGNAL DYNAMIC RANGE ENHANCEMENT FOR OUTPUT OF CHARGE PUMP BASED AUDIO AMPLIFIER

(75) Inventors: Marcellus R. Chen, Fremont, CA (US); Ansuya P. Bhatt, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1343 days.

(21) Appl. No.: 11/694,931

(22) Filed: Mar. 30, 2007

(51) Int. Cl.
*H03F 21/00* (2006.01)

(52) U.S. Cl.
USPC .............................. 381/120; 330/10

(58) Field of Classification Search
USPC ........ 381/120, 28, 55, 104; 330/10, 297, 250, 330/251, 270 R, 207 A, 302, 296
See application file for complete search history.

(56) References Cited

U.S. PATENT DOCUMENTS

| | | | |
|---|---|---|---|
| 6,636,103 B2 * | 10/2003 | Wurcer et al. | 327/536 |
| 7,061,327 B2 * | 6/2006 | Doy | 330/297 |
| 7,679,451 B2 * | 3/2010 | Chen et al. | 330/297 |

OTHER PUBLICATIONS

80mW, DirectDrive Stereo Headphone Driver with Shutdown, Maxim Integrated Products, pp. 1-20, Oct. 2002.*
National Semiconductor Corporation, "LM4920 Boomer Audio Power Amplifier Series, Ground-Referenced, Ultra Low Noise, Fixed Gain, 80mW Stereo Headphone Amplifier" data sheet, Oct. 2006, 17 pages.

* cited by examiner

*Primary Examiner* — Lun-See Lao
(74) *Attorney, Agent, or Firm* — Andrew Viger; Wade J. Brady, III; Frederick J. Telecky, Jr.

(57) ABSTRACT

Separate control of the operation of an audio amplifier and a charge pump that synthesizes a negative voltage supply (VSS) for improving the dynamic range of the audio amplifier. The audio amplifier is typically powered by a single positive power supply (VDD) and the charge pump is arranged to synthesize a negative voltage supply rail (VSS) that enables a greater dynamic range for the amplifier's "on" and "shut down" modes of operation. Also, when the audio amplifier enters its shut down mode of operation to create at least some isolation from Line_In audio signals provided at the amplifier's output by other electronic devices, the amplifier's charge pump stays "on" and continues to provide the negative voltage supply rail (VSS). In this way, the greater dynamic range offered by the presence of both the positive and negative voltage rails is provided even if the amplifier is in a shut down mode.

14 Claims, 6 Drawing Sheets

LINE-IN SIGNAL DYNAMIC RANGE ENHANCEMENT FOR OUTPUT OF CHARGE PUMP BASED AUDIO AMPLIFIER

FIELD OF THE INVENTION

The invention relates generally to amplifier circuits, and more particularly, to audio amplifier circuits that operate with a single positive voltage supply such as a battery.

BACKGROUND OF THE INVENTION

Single positive voltage supplies are relatively common for audio amplifiers in mobile devices powered by a battery. In the past, an audio amplifier powered by a single positive voltage supply provided a relatively limited dynamic range for the audio signal to drive speakers, or headphones. In particular, the maximum peak-to-peak swing of the audio signal was relatively limited or clamped between the power supply's positive output supply rail (VDD) and ground. See FIG. 1A for graph 100 of a Line_In audio signal whose potential dynamic range is clamped between the VDD rail and ground.

To improve the dynamic range for an audio signal, some audio amplifiers powered by a single positive voltage supply have also included a charge pump circuit to synthesize a negative voltage supply rail (VSS). The charge pump circuit can be arranged to provide the VSS voltage rail with a magnitude that can be relatively equivalent to the magnitude of the positive voltage supply rail (VDD). By providing relatively equivalent negative and positive voltage supply rails (VSS and VDD) to the audio amplifier, the maximum peak to peak swing of the audio signal and corresponding dynamic range can be relatively twice as large as a somewhat similar audio amplifier that only enables the audio signal to swing between the VDD rail and ground.

FIG. 1B illustrates graph 110 of a Line_In audio signal that can swing between the VDD rail and the VSS rail. Also, the magnitudes of the VDD and VSS rails illustrated in FIG. 1B are relatively the same, and these magnitudes are also relatively similar to the magnitude of the VDD rail shown in FIG. 1A. Although a sinusoidal Line_In signal is shown in FIGS. 1A and 1B, the invention is not so limited. Rather, the Line_In signal can be a digital signal, square wave signal, triangular wave signal, or any other type of waveform, without departing from the spirit and scope of the invention.

FIG. 1C illustrates graph 100 of an audio signal whose potential dynamic range is clamped between the VDD rail and ground. Also, FIG. 1D illustrates graph 130 of an audio signal that can swing between the VDD rail and the VSS rail. Also, the magnitudes of the VDD and VSS rails illustrated in FIG. 1D are relatively the same, and these magnitudes are also relatively similar to the magnitude of the VDD rail shown in FIG. 1C.

In many electronic devices, it has become more common to connect Line_In audio signals from other electronic devices to the output of an audio amplifier. However, when an audio amplifier with a charge pump circuit is placed in a shut down mode to isolate these Line_In signals from the audio amplifier's components, it is a relatively common practice to also disable the charge pump circuit which turns off the VSS voltage rail. Without the presence of the VSS voltage rail, the dynamic range of the Line_In audio signal from another electronic device coupled to the amplifier's output can be limited while the audio amplifier is in a shut down mode.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description Of The Embodiments, which is to be read in association with the accompanying drawings, wherein.

DETAILED DESCRIPTION OF THE EMBODIMENTS

Figure 1A:
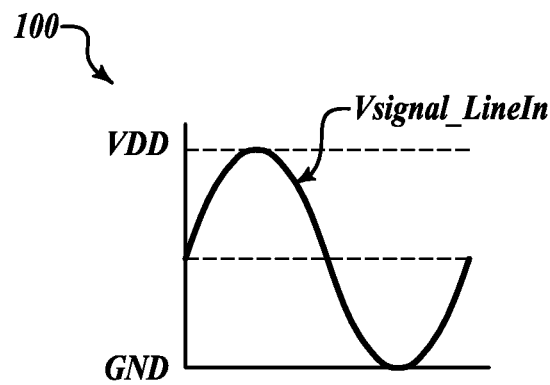
FIG. 1A illustrates a graph of a Line_In signal that is banded by the positive voltage supply rail (VDD) and ground (GND)
Figure 1B:
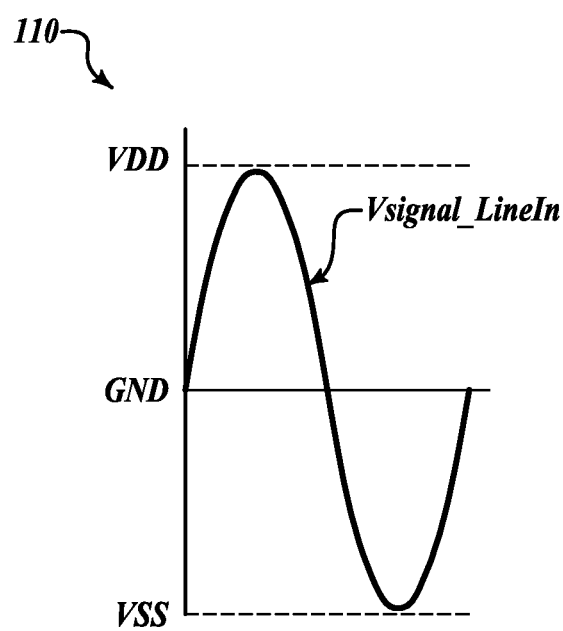
FIG. 1B shows a graph of a Line_In signal that is banded by the positive voltage supply rail (VDD) and the negative voltage supply rail (VSS)
Figure 1C:
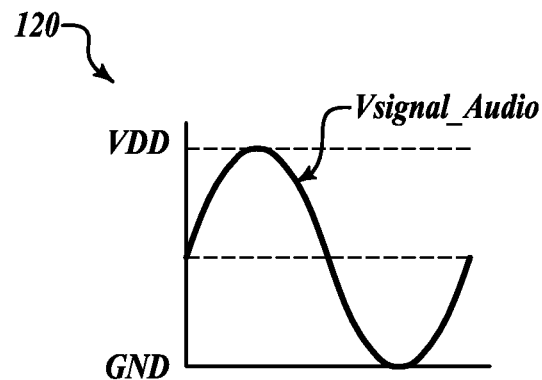
FIG. 1C illustrates a graph of an audio signal that is banded by the positive voltage supply rail (VDD) and ground (GND)
Figure 1D:
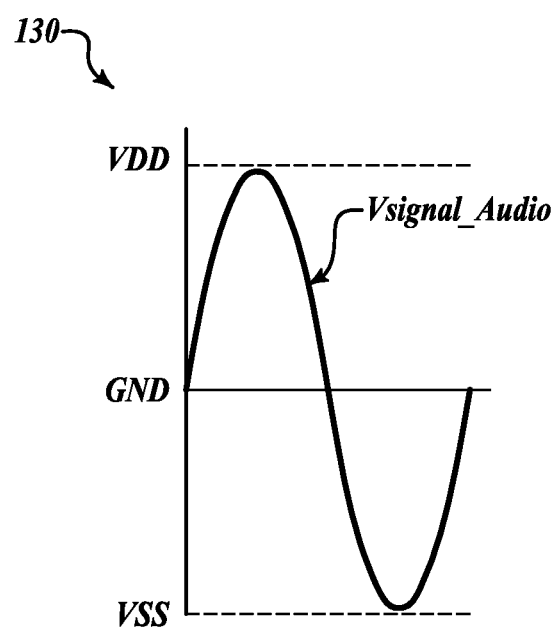
FIG. 1D shows a graph of an audio signal that is banded by the positive voltage supply rail (VDD) and the negative voltage supply rail (VSS)

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and the include plural references. The meaning of in includes in and "on."

Briefly stated, the invention is directed to separately controlling the operation of an audio amplifier and a charge pump that synthesizes a negative voltage supply (VSS) for improving the dynamic range of audio signals amplified by the audio amplifier. The audio amplifier is typically powered by a single positive power supply (VDD) and the charge pump is arranged to synthesize a negative voltage supply rail (VSS) that enables a greater signal "swing" and corresponding dynamic range for the amplifier in both an "on" mode and a "shut down" mode of operation. In particular, when the audio amplifier is in the "on" mode, the charge pump provides the negative voltage supply rail (VSS) with a magnitude that is relatively similar to the magnitude of the positive voltage supply (VDD). In this fashion, the dynamic range of an audio amplifier that enables an audio signal to swing between the VDD and VSS rails is relatively double another dynamic range offered by another audio amplifier that only enables the audio signal to swing between the VDD rail and ground, where the magnitude of the VDD and VSS rails are relatively similar for both of the amplifiers.

In at least one or more embodiments, to prevent damage and spurious signals from electrostatic discharges, at least one diode is separately coupled between the output of the audio amplifier and the positive voltage supply rail (VDD) and at least a second diode is separately coupled between the audio amplifier's output and the negative voltage supply rail (VSS). In at least one or more embodiments, when the audio amplifier enters its shut down mode of operation to create at least some isolation from Line_In signals provided at the amplifier's output by other electronic devices, the amplifier's charge pump stays "on" and continues to provide the negative voltage supply rail (VSS). In this way, the greater dynamic range offered by the presence of both the positive and negative voltage rails is still available at the node associated with the output of the audio amplifier even if the amplifier is in a shut down mode.

In at least one embodiment, an external interface is provided to separately control the operation of the audio amplifier and the charge pump in an integrated circuit. In at least one embodiment, this external interface is arranged to operate with a digital and/or analog control signal, which can be provided in a serial or parallel manner to separately control the operation of the charge pump and the audio amplifier. In at least one or more embodiments, the external interface supports an inter-integrated circuit bus, e.g., I2C, or the like.

Exemplary Embodiments

For an electronic device with an audio amplifier, it has become common to connect Line_In audio signals from other electronic devices to the output of the audio amplifier. Sometimes, an electronic switch with a relatively high "off" impedance and a relatively low "on" impedance is provided to isolate the audio amplifier's components from the Line_In audio signal provided by the other electronic devices. The Rout_effective for such an arrangement of components provides a relatively high impedance as seen by the other electronic components at the node coupled to the output of the audio amplifier.

Figure 2A:
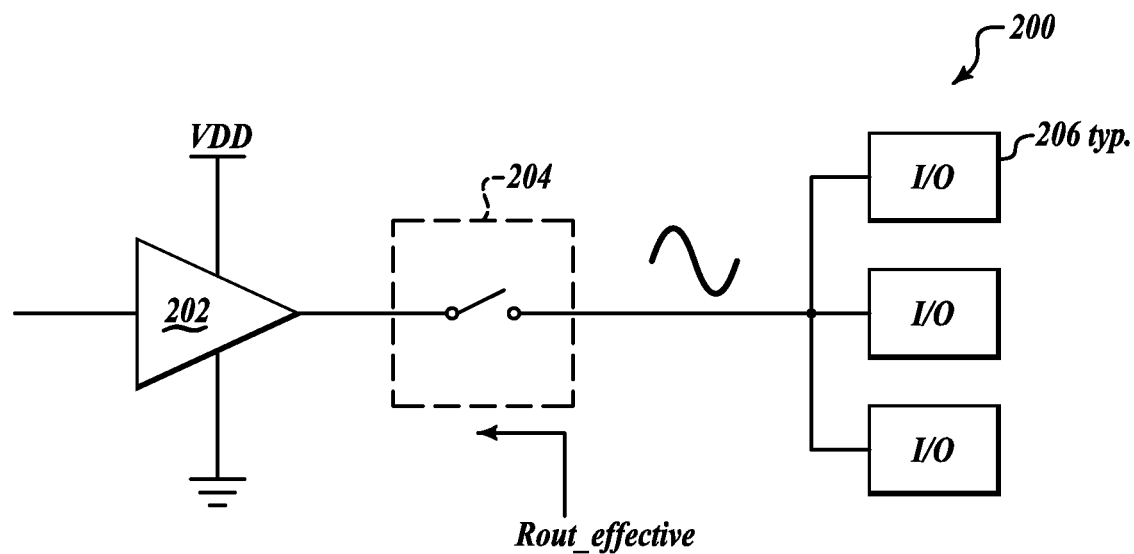
FIG. 2A illustrates an audio amplifier circuit with an electronic switch for isolating the amplifier from other electronic devices.

FIG. 2A illustrates an exemplary amplification circuit 200 with audio amplifier 202, and electronic switch 204 that is coupled to other electronic devices 206. Rout_effective represents the impedance seen by other electronic devices 206 coupled to the audio amplifier's output. Unfortunately, electronic switches are relatively costly and can add to the complexity of manufacturing an audio amplifier circuit.

Figure 2B:
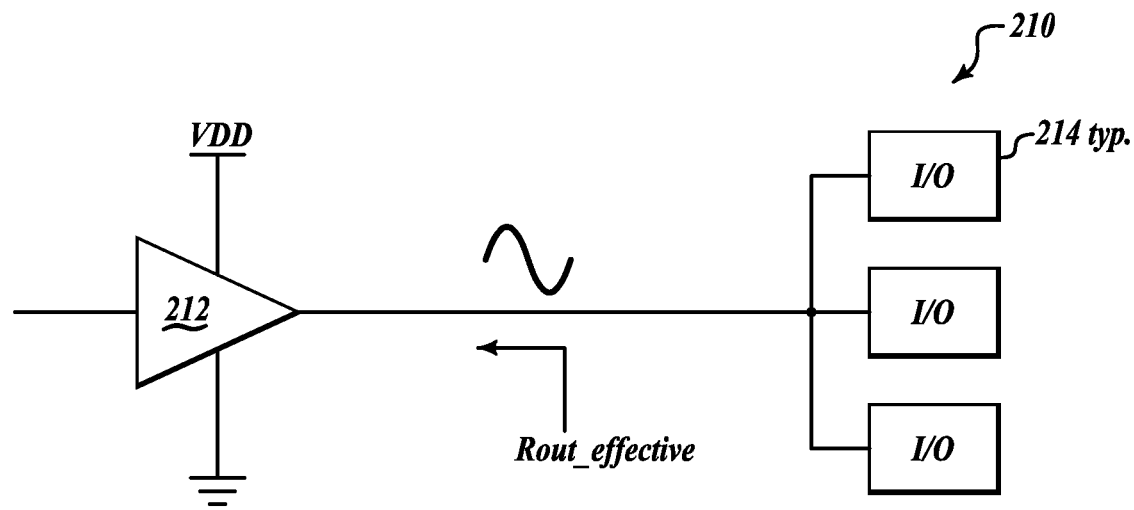
FIG. 2B shows an audio amplifier circuit with a shut down mode for isolating the amplifier from other electronic devices.

Providing a shut down mode for most components included in an audio amplifier is yet another way to isolate a Line_In signal provided by other electronic devices at the output of the audio amplifier. FIG. 2B illustrates an exemplary amplification circuit 210 with audio amplifier 212 and other electronic circuits 214. Also, because the audio amplifier's components are turned off in the shut down mode, a relatively high impedance (Rout_effective) is seen by the other electronic devices coupled to the audio amplifier's output.

Figure 2C:
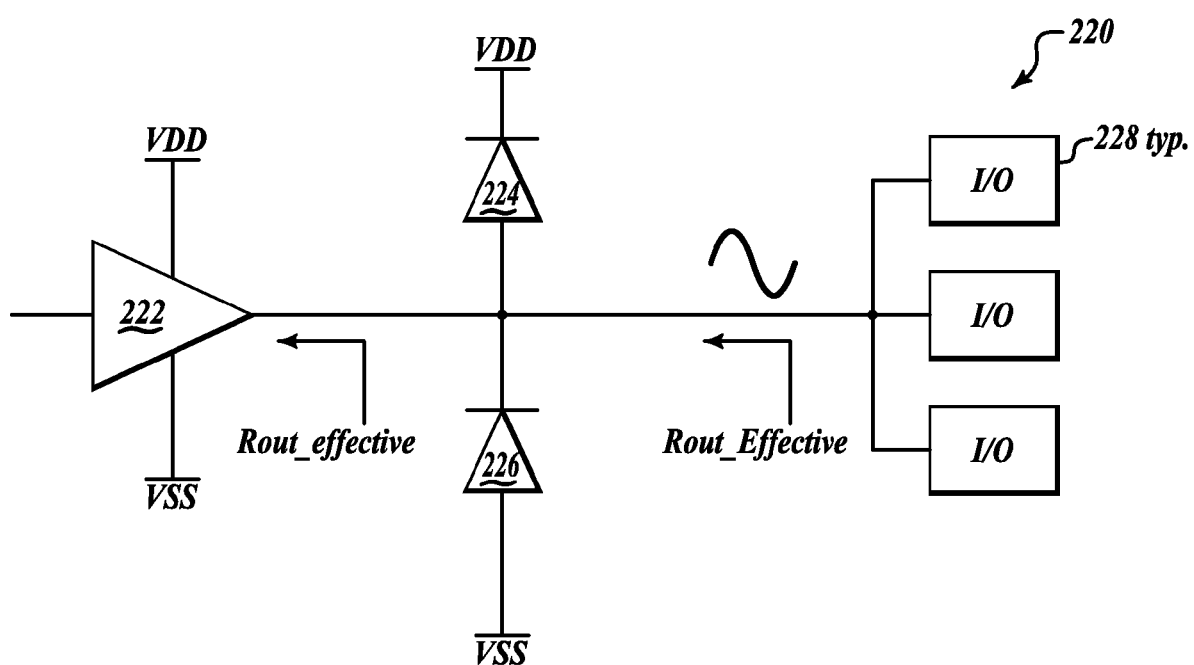
FIG. 2C illustrates an audio amplifier circuit with diodes coupled to the positive and negative power supply rails to protect the amplifier from electrostatic discharge and a shut down mode for isolating the amplifier from other electronic devices.

FIG. 2C illustrates audio amplifier circuit 220 with audio amplifier 222 coupled to a positive voltage supply rail (VDD) and a negative voltage supply rail (VSS). In this embodiment, diodes are arranged to protect the audio amplifier's components from electrostatic discharge, i.e., at least one diode is coupled between the audio amplifier's output and each power supply rail (VDD and VSS). As shown, diode 224 is coupled between the audio amplifier's output and the positive voltage supply rail (VDD), and diode 226 is coupled between the audio amplifier's output and the negative voltage supply rail (VSS). The arrangement of diodes 224 and 226 at least protects the components of amplifier 222 from some aspects of electrostatic discharge. Also, amplifier 222 is arranged to provide a shut down mode so that the Rout_effective impedance of the audio amplifier components prior to the connection of diodes 224 and 226 and the Rout_effective impedance (after the connection of the diodes) is seen as a relatively high impedance by other electronic devices 228 coupled to the output of the amplifier.

Unfortunately, when an audio amplifier with a charge pump circuit is placed in a shut down mode it has been common practice to also disable the charge pump circuit (VSS rail is shut down too). When this condition occurs, a relatively large Line_In audio signal from another electronic device can "turn on" at least one of the diodes arranged for electrostatic discharge protection. And once the diodes start turning on in this fashion, the absence of the VSS rail (charge pump is off) causes the peak to peak swing of the other electronic device's Line_In audio signal to be clamped between the VDD rail and ground at the output of the audio amplifier. As discussed above, the dynamic range for an audio signal clamped between the VDD rail and ground is almost half that of the potential dynamic range for an audio amplifier that can output an audio signal that can swing between the VDD and VSS rails.

Figure 3:
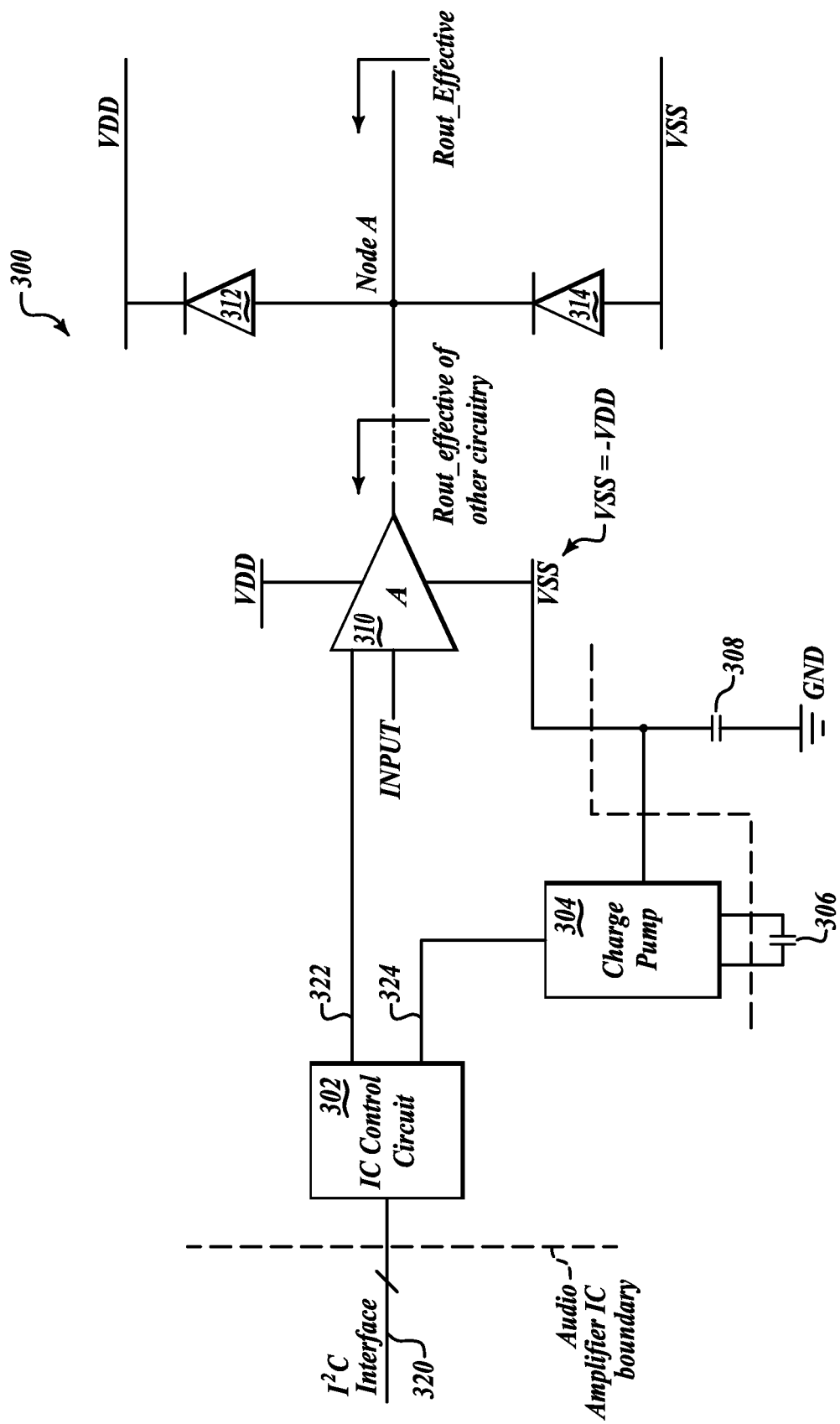
FIG. 3 shows an embodiment for separately controlling the operation of a charge pump coupled to an audio amplifier.

FIG. 3 illustrates integrated circuit (IC) 300 and its sub-components that enable an amplifier that can operate in an "on" mode and a "shut down" mode without degrading the dynamic range of an audio signal presented at a node coupled to the output of the amplifier. IC control circuit 302 provides external input interface 320 that can at least enable separate control of the operation of audio amplifier 310 and charge pump 304. Input interface 320 can be arranged to receive digital and/or analog control signals in a serial or parallel format. Further, as shown in the exemplary embodiment, an inter-integrated circuit bus, such as an I2C bus, is supported by input interface 320 for at least controlling the separate operation of audio amplifier 310 and charge pump 304. Also, control circuit 302 outputs digital and/or analog signals, either serially or in parallel, on control line 324 to charge pump 304 to separately control the operation of the charge pump. Charge pump 304 employs two external capacitors (flying capacitor 306 and holding capacitor 308) to create a negative power supply voltage rail (VSS) from the operation of the positive voltage supply (VDD). Although the flying capacitor 306 and holding capacitor 308 are shown located physically external to IC 300, they are also directly coupled to inputs to charge pump 304. Additionally, in at least one or more embodiments, control circuit 302 can be implemented as a state machine by digital and/or analog components.

Control circuit 302 outputs digital and/or analog signals, either serially or in parallel, on control line 322 to separately control the operation of audio amplifier 310. When audio amplifier 310 is in the "on" mode, it receives audio signals at its input and outputs the amplified audio signals to node A. Also, audio amplifier 310 is arranged to operate between the positive voltage supply rail (VDD) and the negative voltage supply rail (VSS) which are both shown coupled to the amplifier. In this fashion, an audio signal outputted by audio amplifier 310 can benefit from a dynamic range that swings between the VDD and VSS rails.

To prevent damage from electrostatic discharges, diode 312 is shown coupled between node A and the positive voltage supply rail (VDD), and diode 314 is shown coupled between node A and the negative voltage supply rail (VSS). Also, R effective is shown as the impedance of amplifier 310 (before any impedances are added by the connection of diodes 312 and 314). Further, Rout_effective is shown as the total impedance (including amplifier 310 and diodes 312 and 314) that is seen by other external electronic devices which are coupled to node A.

In operation, control circuit 302 enables charge pump 306 to continue to provide the negative voltage supply rail (VSS) to both amplifier 310 and diode 314 even when amplifier 310 is separately placed in a shut down mode. In this way, the biasing of diodes 312 and 314 at node A does not inadvertently reduce the dynamic range available to Line_In audio signals provided by other external electronic devices. Also, audio amplifier 310 can be controlled by control circuit 302 to operate in at least two modes, an "on mode, "shut down" mode, or the like. The "on" mode enables an audio signal presented at the amplifier's input to be amplified and presented at the amplifier's output. Additionally, the "shut down" mode de-energizes at least a portion of the amplifier's components when a Line_In audio signal is provided by other external electronic devices at the output of the amplifier.

Figure 4:
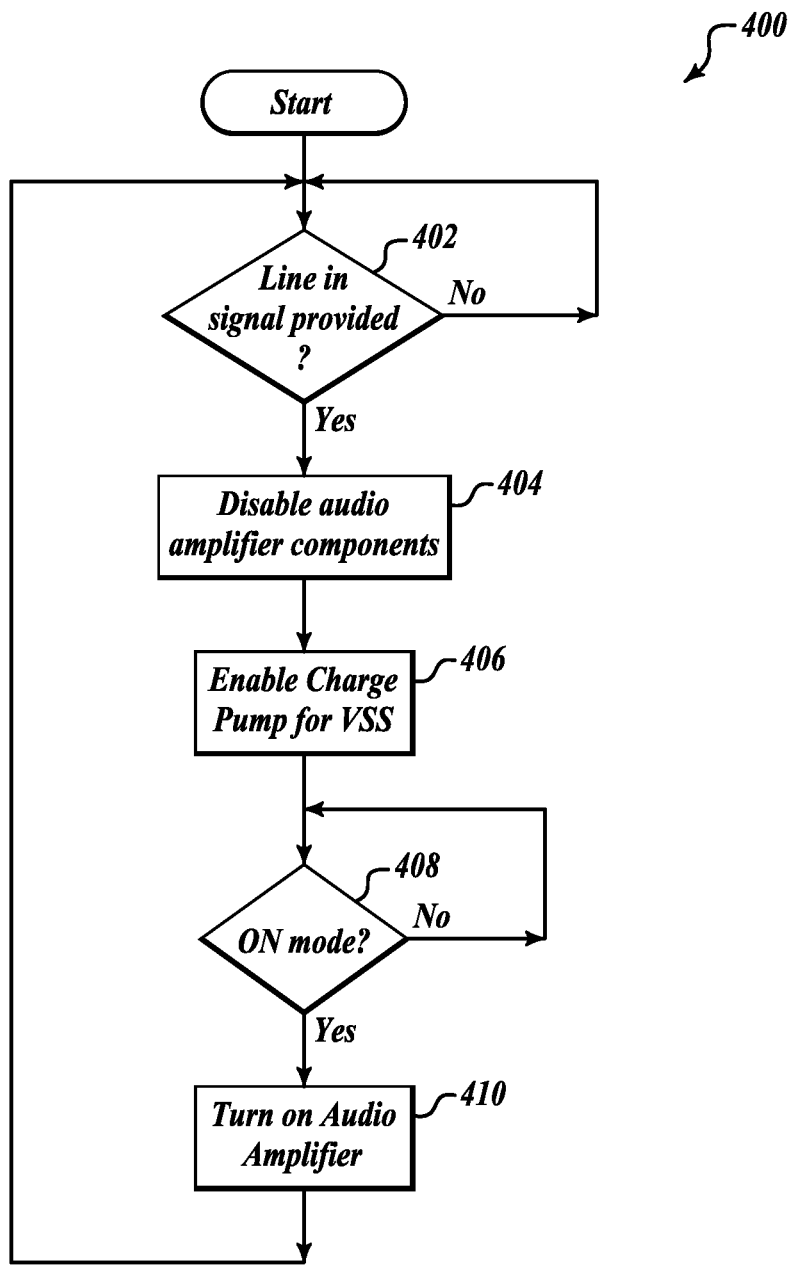
FIG. 4 illustrates a flow chart for amplifying a signal, in accordance with the invention.

FIG. 4 illustrates a method for separately controlling the operation of an audio amplification circuit and a charge pump that synthesizes a negative power supply rail (VSS), which is at least used to enable a greater dynamic range for audio signals outputted by an audio amplifier and Line_In audio signals presented at the output by other electronic devices.

Moving from a start block, the process flows to block 402 where a determination is made as to whether or not at least some components of an audio amplifier are to be de-energized to accommodate a Line_In audio signal from another electronic device that is presented at the output of the audio amplifier. The audio amplifier is typically powered by both the positive and negative power supply rails (VDD and VSS), and provides a dynamic range for audio signals that can swing between the two rails.

At block 404, the process places the audio amplifier in a shut down mode by disabling at least at least portion of the components for the audio amplifier. Stepping to block 406, the process enables the charge pump to continue to provide the negative voltage supply rail (VSS) to the amplifier and at least one terminal of a diode whose other terminal is also coupled to a node at the output of the audio amplifier.

Flowing to block 408, the process determines if the audio amplifier has been selected to switch back to the "on" mode of operation. If not true, the process loops. However, if the determination is true, then the process moves to block 410 where the components of the audio amplifier are turned back on. Next, the process loops back to block 402 and continues performing actions that are substantially similar to those discussed above.

It will be understood that each block of the above flowchart illustrations, and combinations of blocks in the flowchart illustrations, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions executing on the processor provide steps for implementing the actions listed in the flowcharts discussed above.

Accordingly, blocks of the flowchart illustrations support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed as new and desired to be protected by Letters Patent of the United States is:

1. An apparatus for audio amplification, operable with at least one Line-In device, comprising:
　an audio amplifier circuit configured to receive an audio signal and output an amplified audio signal at an output, the audio amplifier circuit operable in:
　　an on mode in which the received audio signal is amplified and the amplified audio signal is output, and
　　a shutdown mode in which at least some circuitry associated with amplification and outputting an amplified audio signal is disabled;
　a charge pump circuit for generating the negative voltage supply based on a positive voltage supply;
　a first diode coupled between the output of the audio amplifier circuit and the positive voltage supply, and a second diode coupled between the output of the audio amplifier circuit and the negative voltage supply; and
　a control circuit that is arranged to separately control (i) the on and shutdown modes of operation for the audio amplifier circuit, and (ii) the charge pump circuit;
　wherein the control circuit is operative to concurrently enable the operation of the charge pump circuit to generate the negative voltage supply and enable operation of the audio amplifier circuit in the shut down mode, thereby enabling the audio amplifier circuit, in the shutdown mode, to present to Line-In audio signals from the at least one Line-In device coupled to the output of the audio amplifier circuit a dynamic range between the positive and negative voltages as in the on mode.

2. The apparatus of claim 1, wherein the control circuit further comprises an external interface that is arranged to communicate by at least one of a digital signal, analog signal, serial control signal, parallel signal, inter-integrated circuit bus, or 12C bus.

3. The apparatus of claim 1, wherein the control circuit further comprises at least one control signal that establishes at least one of an on mode of operation and the shut down mode of operation for the audio amplifier circuit.

4. The apparatus of claim 1, wherein the control circuit further comprises at least one control signal that enables the operation of the charge pump circuit, and another control signal that disables the operation of the charge pump circuit.

5. The apparatus of claim 1, further comprising a flying capacitor that has both ends coupled to the charge pump circuit.

6. The apparatus of claim 1, further comprising at least a holding capacitor that has one end coupled to the charge pump circuit and the negative voltage supply and another end coupled to ground.

7. The apparatus of claim 1, wherein at least one of the first diode and the second diode are arranged to prevent a deleterious effect from an electrostatic discharge.

8. The apparatus of claim 1, further comprising a node that is coupled to the output of the audio amplifier, wherein the node is adapted for connecting to at least one external electronic device, and wherein the external electronic device provides at least a Line_In audio signal at the node.

9. The apparatus of claim 1, wherein the apparatus is an integrated circuit.

10. A method for audio amplification in a system with an audio amplifier circuit coupled at an output to at least on Line-In device, the audio amplifier circuit operable in an on mode in which audio amplification is enabled to output an amplified audio signal, and a shutdown mode in which audio amplification to output an amplified audio signal is disabled, the audio amplifier circuit including a charge pump circuit for generating a negative voltage supply based on a positive voltage supply, comprising:

selectively controlling the audio amplifier circuit to operate in the on mode, while enabling the charge pump to generate the negative voltage supply; and selectively controlling the audio amplifier circuit to operate in the shutdown mode, while enabling the charge pump to generate the negative voltage supply;

thereby enabling the audio amplifier circuit, in the shutdown mode, to present to Line-In audio signals from the at least one Line-In device a dynamic range between the positive and negative voltages as in the on mode.

11. The method of claim 10, further comprising detecting if the Line_In audio signal is provided at the output of the audio amplifier circuit.

12. The method of claim 10, further comprising reducing deleterious effects from electrostatic discharge with at least one diode coupled between the audio amplifier circuit's output and the positive voltage supply and at least another diode coupled between the audio amplifier circuit's output and the negative voltage supply.

13. A system for audio amplification, comprising:

an audio amplifier coupled at an output to at least one Line-In device;

the audio amplifier configured to receive an audio signal and output an amplified audio signal, the audio amplifier circuit operable in an on mode in which the received audio signal is amplified and the amplified audio signal is output, and a shutdown mode in which at least some circuitry associated with amplification and outputting an amplified audio signal is disabled;

a charge pump circuit for generating the negative voltage supply based on a positive voltage supply;

a first diode coupled between the output of the audio amplifier and the positive voltage supply, and a second diode coupled between the output of the audio amplifier arid the negative voltage supply; and a control circuit that is arranged to separately control (i) the on and shutdown modes of operation for the audio amplifier, and (ii) the charge pump circuit;

wherein the control circuit is operative to concurrently enable the operation of the charge pump circuit to generate the negative voltage supply and enable the audio amplifier in the shut down mode, thereby enabling the audio amplifier, in the shutdown mode, to present to Line-In audio signals from the at least one Line-In device a dynamic range between the positive and negative voltages as in the on mode.

14. The system of claim 13, wherein the control circuit further comprises an external interface that is arranged to communicate by at least one of a digital signal, analog signal, serial control signal, parallel signal, inter-integrated circuit bus, or I2C bus.

* * * * *